United States Patent
Jiang et al.

(10) Patent No.: US 11,664,655 B2
(45) Date of Patent: May 30, 2023

(54) CURRENT LIMITING PROTECTION SYSTEM AND METHOD OF MOTOR PRE-DRIVER

(71) Applicant: ANPEC ELECTRONICS CORPORATION, Hsinchu (TW)

(72) Inventors: Jyun-Ping Jiang, Hsinchu (TW); Shih-Hai Chien, Hsinchu (TW)

(73) Assignee: ANPEC ELECTRONICS CORPORATION, Hsinchu (TW)

( * ) Notice: Subject to any disclaimer, the term of this patent is extended or adjusted under 35 U.S.C. 154(b) by 136 days.

(21) Appl. No.: 17/330,421

(22) Filed: May 26, 2021

(65) Prior Publication Data

US 2022/0255314 A1 Aug. 11, 2022

(30) Foreign Application Priority Data

Feb. 8, 2021 (TW) .................................. 110104651

(51) Int. Cl.

| H02P 7/03 | (2016.01) |
|---|---|
| H02H 9/02 | (2006.01) |
| H03K 17/0812 | (2006.01) |
| G01R 1/20 | (2006.01) |
| H02P 7/28 | (2016.01) |
| G01R 19/165 | (2006.01) |

(52) U.S. Cl.
CPC ............... *H02H 9/02* (2013.01); *G01R 1/203* (2013.01); *G01R 19/16538* (2013.01); *H02P 7/04* (2016.02); *H02P 7/28* (2013.01); *H03K 17/08122* (2013.01)

(58) Field of Classification Search
CPC ...... H02P 7/04; H02H 9/02; H03K 17/08122; G01R 1/203; G01R 19/16538
See application file for complete search history.

(56) References Cited

U.S. PATENT DOCUMENTS

| 4,562,393 | A | * | 12/1985 | Loyzim | ..................... | H02P 7/04 |
|---|---|---|---|---|---|---|
| | | | | | | 318/599 |
| 2016/0118890 | A1 | * | 4/2016 | Yamada | ................ | H02M 3/158 |
| | | | | | | 318/490 |

* cited by examiner

*Primary Examiner* — Harry R Behm
(74) *Attorney, Agent, or Firm* — Li & Cai Intellectual Property Office (57) ABSTRACT

A current limit protecting system and method of a motor pre-driver are provided. A current limiting circuit detects a current of a resistor that is connected to a motor, and then compares the current of the resistor with a current threshold to output a current comparing signal. When a controller circuit determines that the current of the resistor is larger than the current threshold according to the current comparing signal, and a working period of a first signal of a first node or a working period of a second signal of a second node of the motor reaches a preset value, a first high-side switch and a second high-side switch are turned off, and a first low-side switch and a second low-side switch are alternately turned on. As a result, a temperature of the motor generally reduces.

5 Claims, 8 Drawing Sheets

CURRENT LIMITING PROTECTION SYSTEM AND METHOD OF MOTOR PRE-DRIVER

CROSS-REFERENCE TO RELATED PATENT APPLICATION

This application claims the benefit of priority to Taiwan Patent Application No. 110104651, filed on Feb. 8, 2021. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a current limit protecting system and method, and more particularly to a current limit protecting system and method of a motor pre-driver by which a bridge driver circuit of a single phase motor is protected.

BACKGROUND OF THE DISCLOSURE

In various electronic products, circuit components produce heat during operation, so that heated air is circulated throughout an enclosed space, e.g., in an enclosed chassis of a server. As a result, other circuit components in the enclosed space are damaged due to overheating. Therefore, fans must be configured in the electronic products and used to cool down the circuit components of the electronic products. However, when a controller circuit controls transistors of a motor driver circuit to drive a motor to rotate blades of the fan, the transistors are heated up by the air circulated throughout the enclosed chassis. In addition, when the transistors are switched by the controller circuit, an excessive current may flow through the transistors to a common voltage, and the common voltage is charged by the excessive current which exceeds a voltage that the transistors can withstand. As a result, the transistors are damaged. Therefore, the current flowing through the transistors must be limited at appropriate times.

SUMMARY OF THE DISCLOSURE

In response to the above-referenced technical inadequacies, the present disclosure provides a current limit protecting system of a motor pre-driver that is applicable to a bridge driver circuit of a single phase motor. The bridge driver circuit includes a plurality of switch components. The switch components include a first high-side switch, a first low-side switch, a second high-side switch and a second low-side switch. A first terminal of the first high-side switch and a first terminal of the second high-side switch are coupled to a common voltage. A first node between a second terminal of the first high-side switch and a first terminal of the first low-side switch is connected to a first terminal of the single phase motor. A second node between a second terminal of the second high-side switch and a first terminal of the second low-side switch is connected to a second terminal of the single phase motor. The second terminal of the second high-side switch and a second terminal of the second low-side switch are connected to a first terminal of a sensing resistor. A second terminal of the sensing resistor is grounded. The current limit protecting system of the motor pre-driver includes a current limiting circuit and a controller circuit. The current limiting circuit is connected to the first terminal of the sensing resistor. The current limiting circuit is configured to sense a current flowing through the sensing resistor and then compare the current with a current threshold to output a current comparison signal. The controller circuit is connected to a control terminal of each of the switch components and the current limiting circuit. The controller circuit is configured to output a plurality of controlling signals respectively to the switch components to turn on or off the switch components according to the current comparison signal. When the controller circuit determines that the current is larger than the current threshold according to the current comparison signal, and a present time falls within any one of maximum working periods of a first signal of the first node or a second signal of the second node, the controller circuit performs a rest protection procedure on the bridge driver circuit to continually turn off the first high-side switch and the second high-side switch, and alternately turn on the first low-side switch and the second low-side switch, during a fixed period of time.

In certain embodiments, when the current flowing through the sensing resistor is larger than the current threshold and the present time falls within any one of the maximum working periods of the first signal, the current flows to the sensing resistor sequentially through the single phase motor and the second low-side switch from the first high-side switch. When the current is larger than the current threshold and the present time falls within any one of the maximum working periods of the second signal, the current flows to the sensing resistor sequentially through the single phase motor and the first low-side switch from the second high-side switch.

In certain embodiments, the controller circuit, according to a level of the current comparison signal, counts a number of times that the current flowing through the sensing resistor is determined to be larger than the current threshold within each of the maximum working periods by the current limiting circuit. When the controller circuit determines that the number of times reaches a predetermined number of times, the controller circuit performs the rest protection procedure.

In certain embodiments, the controller circuit, according to a level of the current comparison signal, counts a number of the maximum working periods within each of which the current flowing through the sensing resistor is larger than the current threshold. The maximum working periods that are counted are consecutive. When the controller circuit determines that the number of the maximum working periods that are counted is larger than a number threshold, the controller circuit performs the rest protection procedure.

In certain embodiments, the controller circuit, according to a level of the current comparison signal, counts a number of times that the current flowing through the sensing resistor is larger than the current threshold within each of the maximum working periods. The controller circuit, according to a level of the current comparison signal, counts a number of the maximum working periods within each of which the current is larger than the current threshold. The maximum working periods that are counted are consecutive. When the controller circuit determines that the number of times reaches a predetermined number of times and the number of the maximum working periods is larger than a number threshold, the controller circuit performs the rest protection procedure.

In addition, the present disclosure provides a current limit protecting method of a motor pre-driver, which is applicable to a bridge driver circuit of a single phase motor. The bridge driver circuit includes a plurality of switch components. The switch components include a first high-side switch, a first low-side switch, a second high-side switch and a second low-side switch. A first terminal of the first high-side switch and a first terminal of the second high-side switch are coupled to a common voltage. A first node between a second terminal of the first high-side switch and a first terminal of the first low-side switch is connected to a first terminal of the single phase motor. A second node between a second terminal of the second high-side switch and a first terminal of the second low-side switch is connected to a second terminal of the single phase motor. A second terminal of the second high-side switch and a second terminal of the second low-side switch are connected to a first terminal of a sensing resistor. A second terminal of the sensing resistor is grounded. The current limit protecting method of the motor pre-driver includes the following steps: detecting a current flowing through the sensing resistor; determining whether or not the current is larger than a current threshold, in response to determining that the current is not larger than the current threshold, returning the previous step, and in response to determining that the current is larger than the current threshold, performing the next step; determining whether or not a present time falls within any one of maximum working periods of a first signal of the first node or a second signal of the second node and the one of the maximum working periods is equal to a predetermined period, in response to determining that the present time does not fall within the one of the maximum working periods of the first signal or the second signal and the one of the maximum working periods is not equal to the predetermined period, switching the switch components and adjusting a working period of the first signal or the second signal to limit a current flowing through each of the switch components such that the single phase motor runs stably, and then returning the previous step, and in response to determining that the present time falls within the one of the maximum working periods of the first signal and the second signal and the one of the maximum working periods is equal to the predetermined period, performing the next step; turning off the first high-side switch and the second high-side switch, and alternately turning on the first low-side switch and the second low-side switch, during a fixed period of time; and after the fixed period of time ends, automatically turning on the first high-side switch or the second high-side switch, and controlling the single phase motor to run stably.

In certain embodiments, the current limit protecting method of the motor pre-driver includes the following steps: generating the current that flows to the sensing resistor sequentially through the single phase motor and the second low-side switch from the first high-side switch, within each of the maximum working periods of the first signal; and generating the current that flows from the second high-side switch to the single phase motor, and then flow to the sensing resistor sequentially through the single phase motor and the first low-side switch from the second high-side switch.

In certain embodiments, the current limit protecting method of the motor pre-driver includes the following steps: counting a number of times that the current flowing through the sensing resistor is larger than the current threshold within each of the maximum working periods; and determining whether or not the number of times reaches a predetermined number of times, in response to determining that the number of times does not reach the predetermined number of times, returning the previous step, and in response to determining that the number of times reaches the predetermined number of times, performing the rest protection procedure.

In certain embodiments, the current limit protecting method of the motor pre-driver includes the following steps: detecting the current flowing through the sensing resistor multiple times; comparing the current detected each time with the current threshold to output a plurality of waveforms of the current comparison signal; counting a number of the maximum working periods of the first signal or the second signal within each of which the current is larger than the current threshold, and the maximum working periods that are counted are consecutive; and determining whether or not the number of the maximum working periods is larger than a number threshold, in response to determining that the number of the maximum working periods is not larger than the number threshold, returning to the previous step, and in response to determining that the number of the maximum working periods is larger than the number threshold, performing the rest protection procedure.

As described above, the present disclosure provides the current limit protecting system and method of the motor pre-driver, which has the following main characteristics:
1. the sensing resistor connected to the single phase motor is detected to obtain the current of the single phase motor;
2. the motor pre-driver compares the current flowing through the sensing resistor with the current threshold to determine whether or not a current limiting procedure is performed during the maximum working period of the first or second signal of the single phase motor;
3. when the current limiting procedure is to be performed during a time period that does not fall within the maximum working period, the current limiting procedure is still performed, but when the current limiting procedure is to be performed within the maximum working period, the rest protection procedure is performed to prevent the switch components, such as the transistors of the bridge driver circuit, from overheating.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 1:
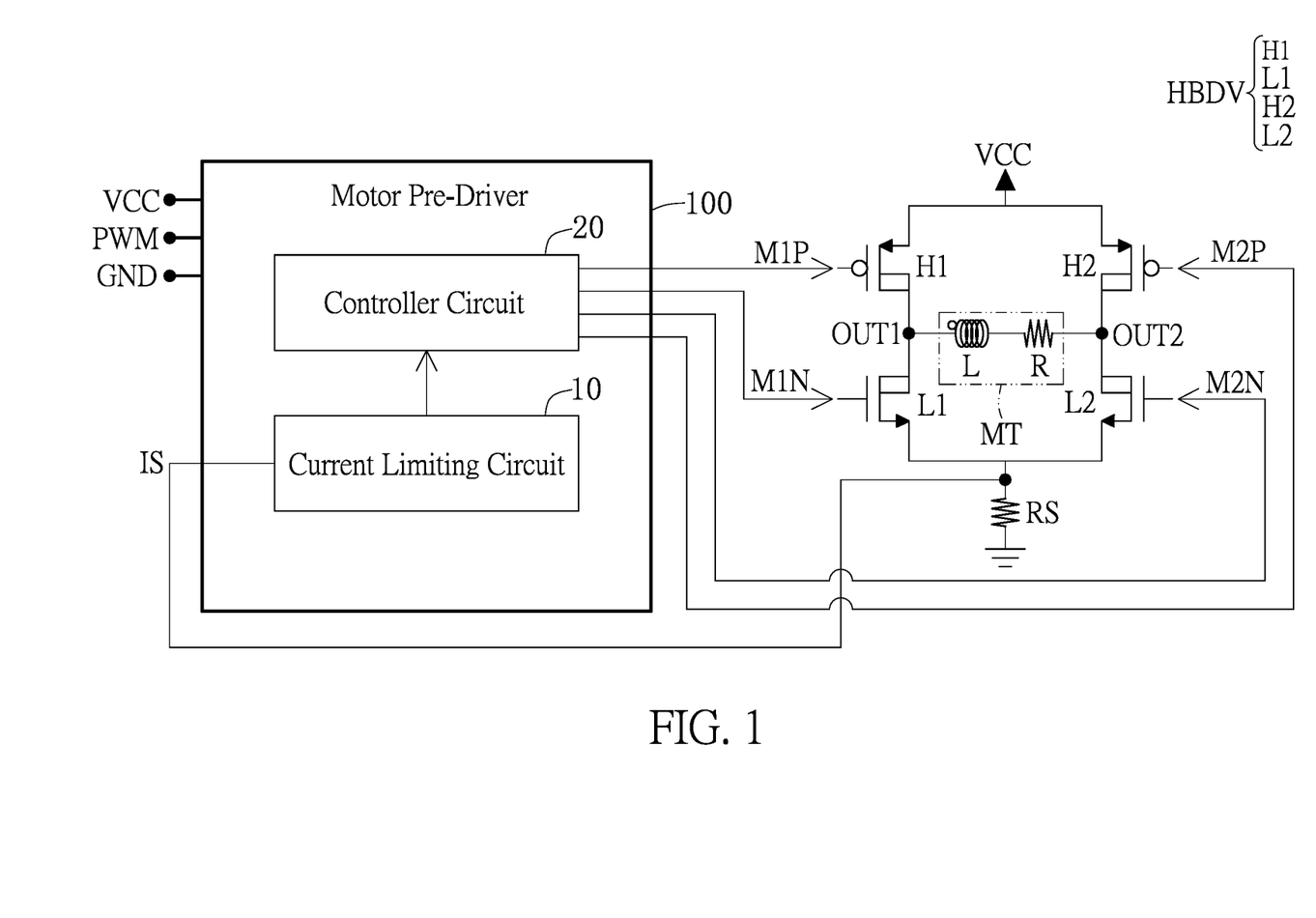
FIG. 1 is a block diagram of a current limit protecting system of a motor pre-driver according to an embodiment of the present disclosure.

Reference is made to FIG. 1, which is a block diagram of a current limit protecting system of a motor pre-driver according to an embodiment of the present disclosure.

As shown in FIG. 1, in the embodiment, the current limit protecting system of the motor pre-driver may include a current limiting circuit 10 and a controller circuit 20 that may be disposed in a motor pre-driver 100. The controller circuit 20 is connected to the current limiting circuit 10 and a bridge driver circuit HBDV. The current limiting circuit 10 is connected to a sensing resistor RS. A single phase motor MT is connected to the bridge driver circuit HBDV and the sensing resistor RS.

The bridge driver circuit HBDV may include a plurality of switch components. The switch components may include a first high-side switch H1, a first low-side switch L1, a second high-side switch H2, and a second low-side switch L2. A control terminal of the first high-side switch H1, a control terminal of the first low-side switch L1, a control terminal of the second high-side switch H2, and a control terminal of the second low-side switch L2 are connected to the controller circuit 20. The controller circuit 20 outputs a plurality of controlling signals M1P, M1N, M2P, M2N respectively for controlling the first high-side switch H1, the first low-side switch L1, the second high-side switch H2, and the second low-side switch L2.

For example, as shown in FIG. 1, the first high-side switch H1 and the second high-side switch H2 are P-type metal oxide semiconductor (PMOS) transistors, and the first low-side switch L1 and the second low-side switch L2 are N-type metal oxide semiconductor (NMOS) transistors, but the present disclosure is not limited thereto.

A first terminal of the first high-side switch H1 and a first terminal of the second high-side switch H2 are coupled to a common voltage VCC. A second terminal of the first high-side switch H1 is connected to a first terminal of the first low-side switch L1. A first node OUT1 between the second terminal of the first high-side switch H1 and the first terminal of the first low-side switch L1 is connected to a first terminal of the single phase motor MT that is a first terminal of an inductor L of the single phase motor MT. A second terminal of the inductor L is connected to a first terminal of a resistor R of the single phase motor MT.

A second terminal of the second high-side switch H2 is connected to a first terminal of the second low-side switch L2. A second node OUT 2 between the second terminal of the second high-side switch H2 and the first terminal of the second low-side switch L2 is connected to a second terminal of the single phase motor MT that is a second terminal of the resistor R of the single phase motor MT. A second terminal of the first low-side switch L1 and a second terminal of the second low-side switch L2 are connected to a first terminal of the sensing resistor RS. A second terminal of the sensing resistor RS is grounded.

Figure 2:
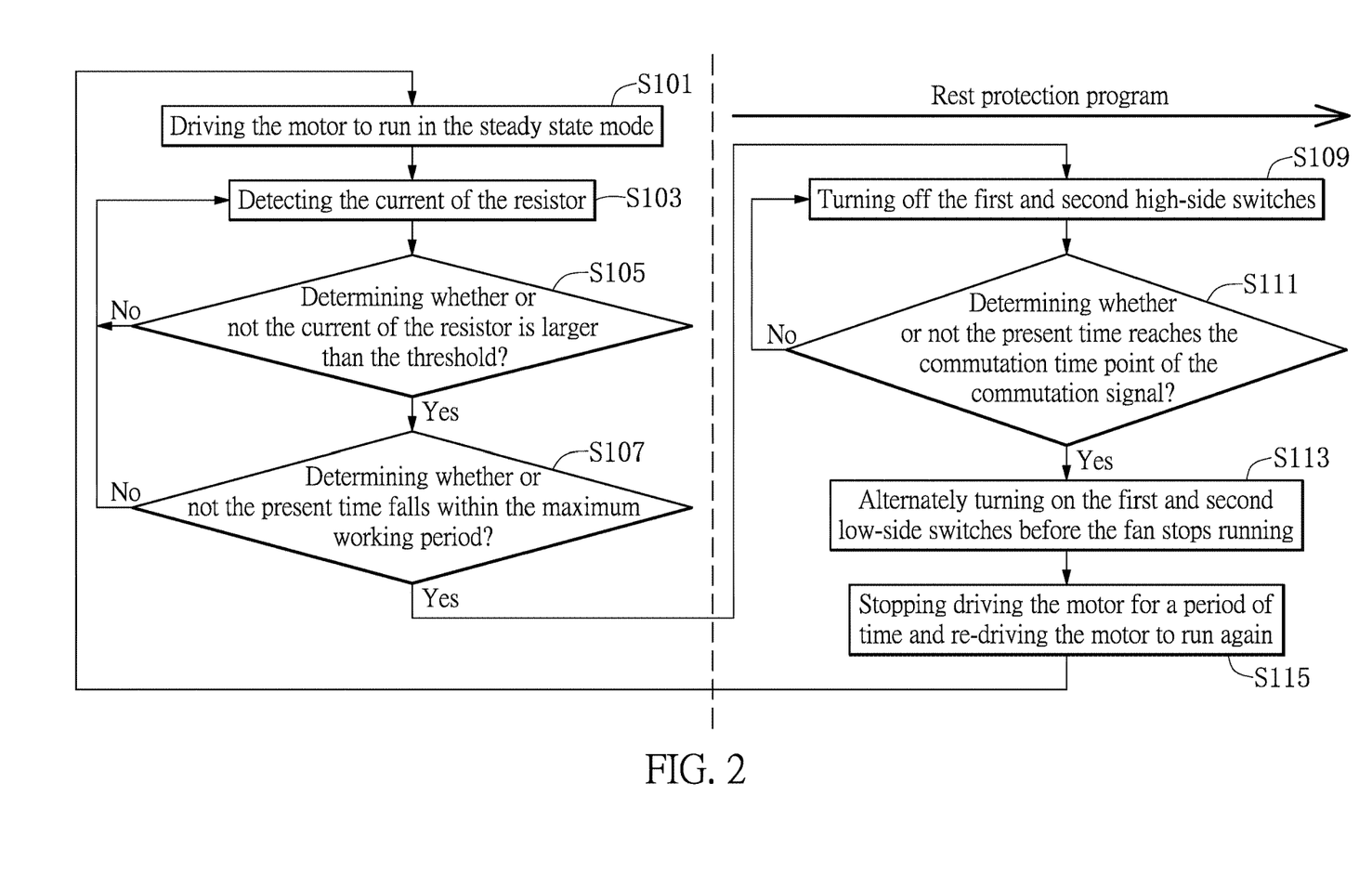
FIG. 2 is a flowchart diagram of a current limit protecting method of the motor pre-driver according to the embodiment of the present disclosure.

Reference is made to FIG. 1 to FIG. 6, in which FIG. 2 is a flowchart diagram of a current limit protecting method of the motor pre-driver according to the embodiment of the present disclosure.

In the embodiment, the current limit protecting method of the motor pre-driver may include steps S101 to S115 as shown in FIG. 2. The steps S101 to S115 may be performed on the single phase motor MT by the current limiting circuit 10 and the controller circuit 20 as shown in FIG. 1, which is specifically described in the following.

In step S101, the controller circuit 20 controls the bridge driver circuit HBDV to drive the single phase motor MT to run in a steady state mode.

Figure 3:
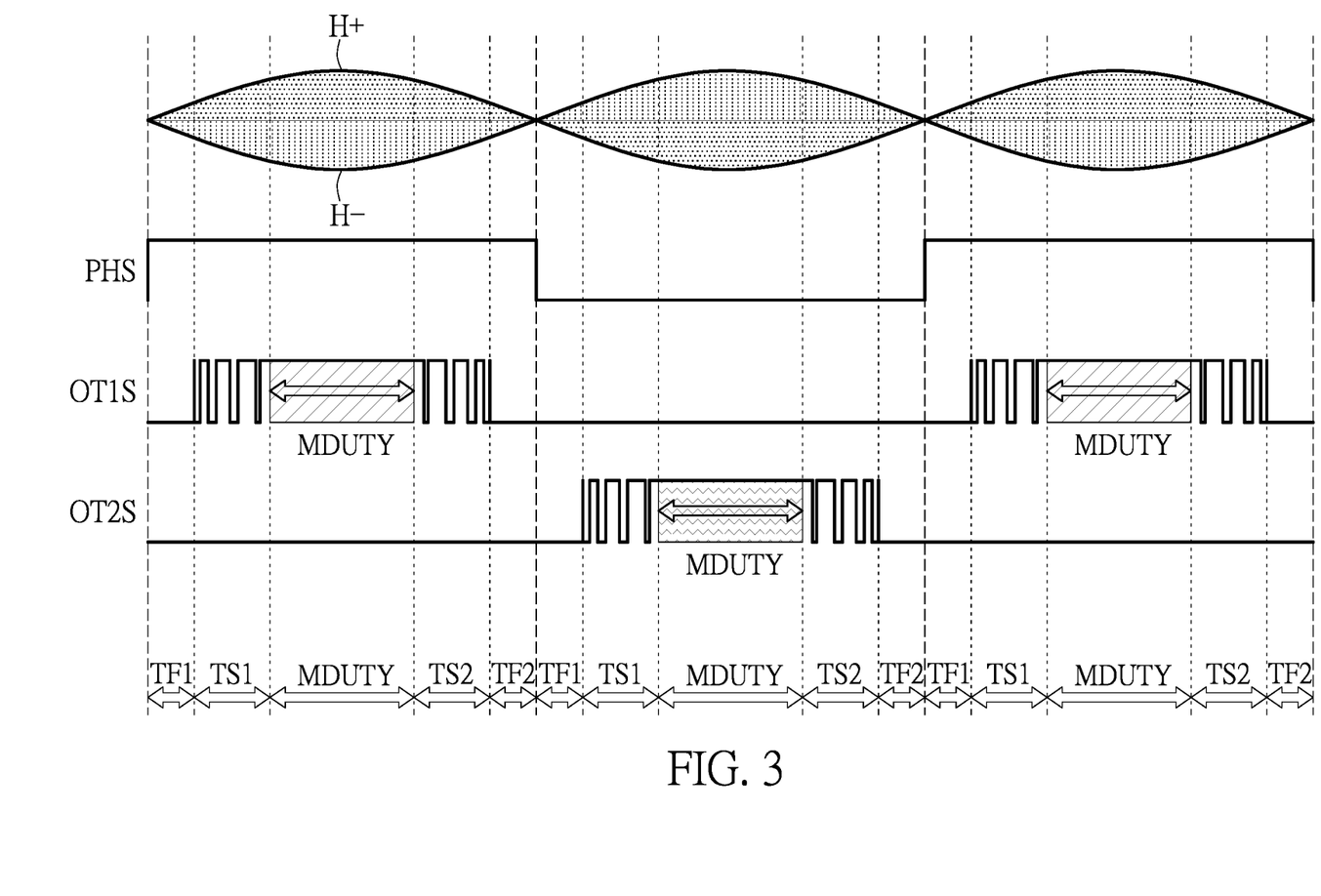
FIG. 3 is a waveform diagram of a Hall signal, a commutation signal, a first signal, and a second signal of a single phase motor that are detected by the current limit protecting system and method of the motor pre-driver according to the embodiment of the present disclosure.
Figure 4:
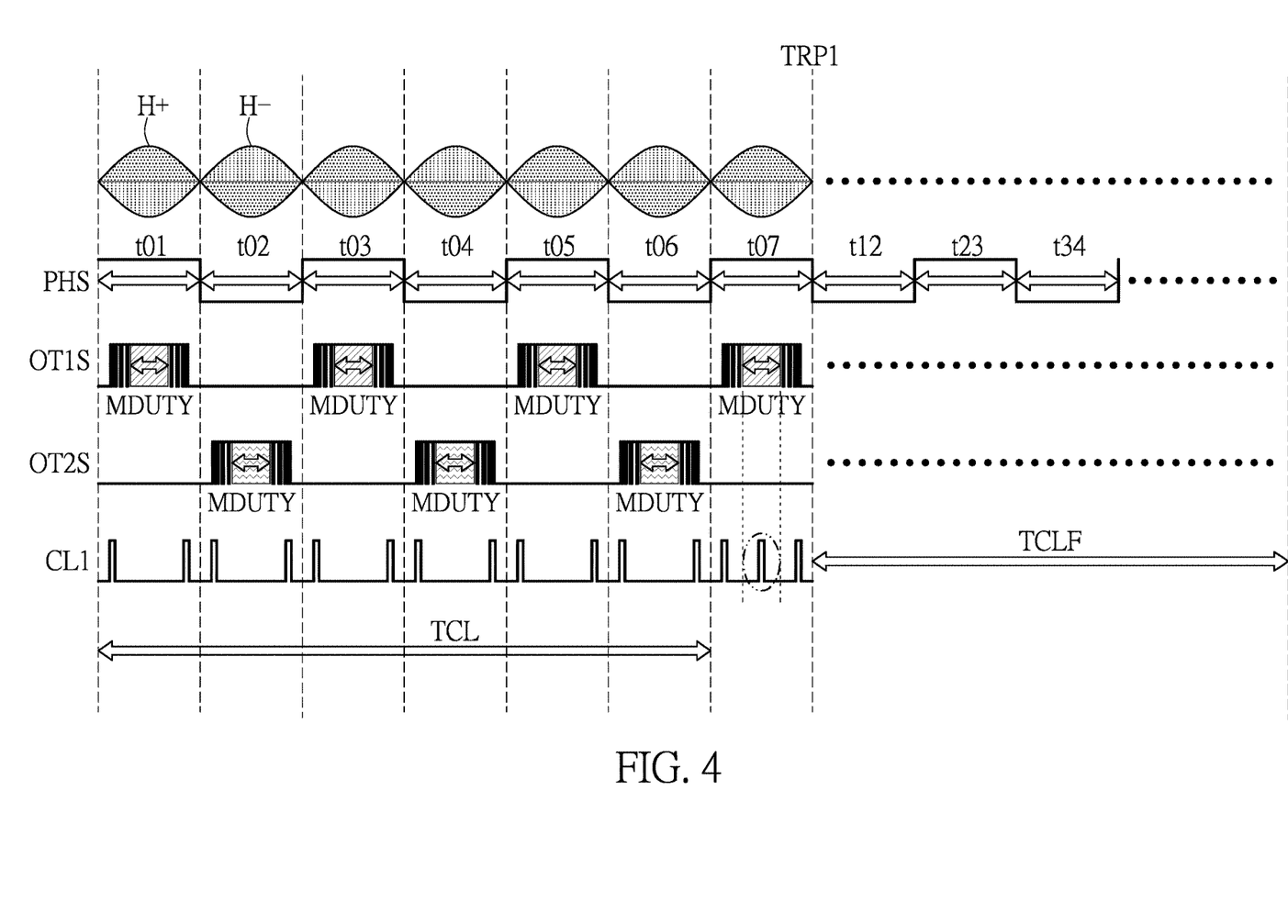
FIG. 4 is a waveform diagram of the Hall signal, the commutation signal, the first signal, the second signal, and a current limiting signal of the single phase motor that are detected by the current limit protecting system and method of the motor pre-driver according to the embodiment of the present disclosure.

A commutation signal PHS shown in FIGS. 3 and 4 indicates that the single phase motor MT is commutated according to transition states of Hall signals H+ and H− that are sensed by a Hall sensor. In the embodiment, time points of rising edges and falling edges of the commutation signal PHS are defined as commutation time points. Before a present time falls within a rest protection time TCLF of the commutation signal PHS as shown in FIG. 4, the controller circuit 20 controls the bridge driver circuit HBDV to drive the single phase motor MT to run in the steady state mode.

Figure 5:
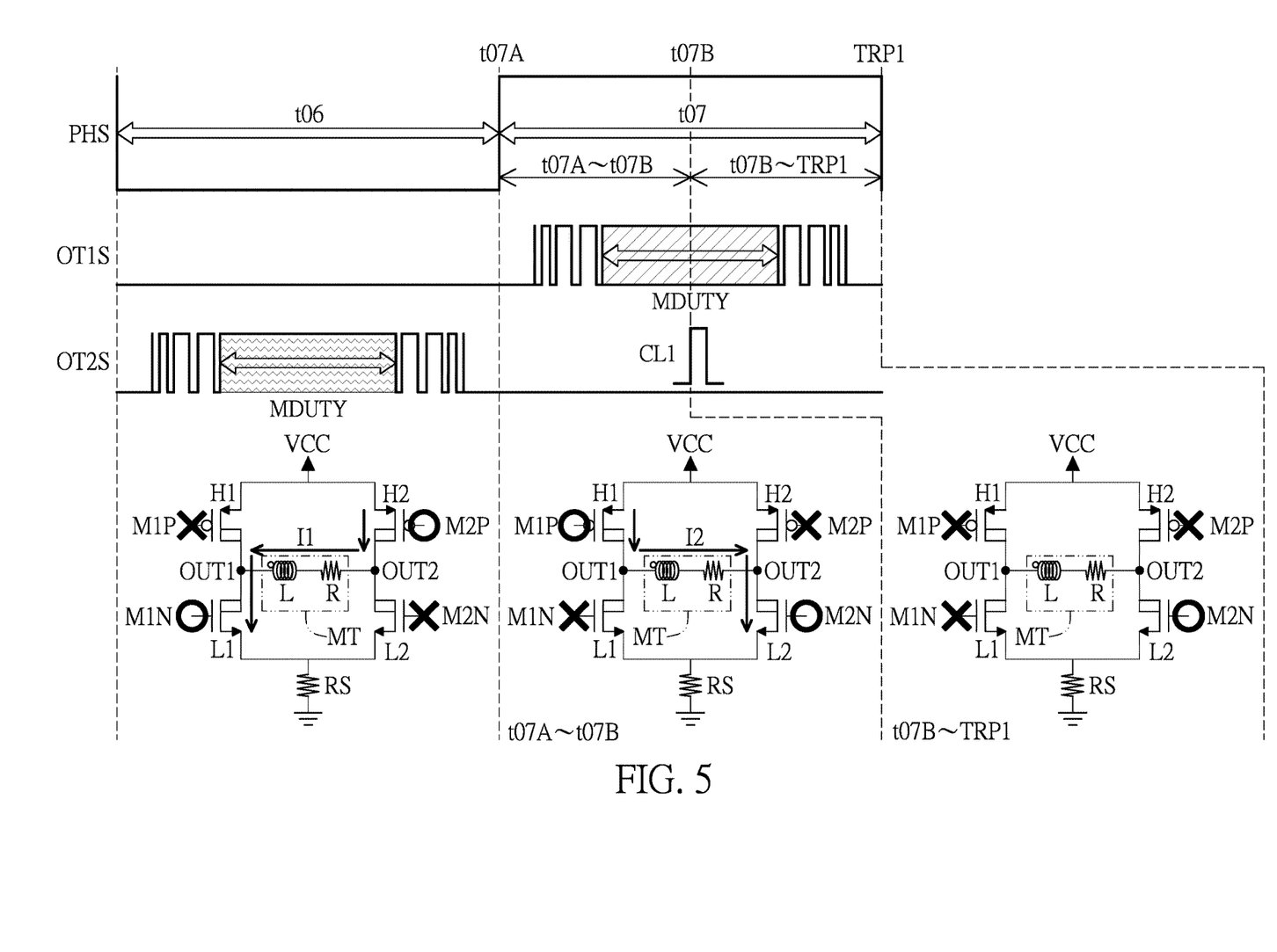
FIG. 5 is a schematic diagram of a bridge driver circuit that is being switched when the single phase motor is driven to run in a steady state mode by the current limit protecting system and method of the motor pre-driver according to the embodiment of the present disclosure.

For example, as shown in FIGS. 4 and 5, the commutation signal PHS reaches a first reference level such as a low level (or a high level in practice), during each of non-working periods t02, t04, t06 of the commutation signal PHS. At this time, the controller circuit 20 turns off the first high-side switch H1 and the second low-side switch L2, but turns on the second high-side switch H2 and the first low-side switch L1 during a first commutation procedure. As a result, a current I1 flows from the second high-side switch H2 sequentially though the single phase motor MT and the first low-side switch L1 to the sensing resistor RS.

Then, when the present time reaches one of the commutation time points of the commutation signal PHS, such as the time point of the rising edge of the commutation signal PHS at which the commutation signal PHS is transiting from a low level to a high level, a second commutation procedure is performed. In practice, the second commutation procedure may be performed at the time point of the falling edge of the commutation signal PHS. In detail, the commutation signal PHS reaches a second reference level such as a high level (or a low level in practice), during each of working periods t01, t03, t05 of the commutation signal PHS and a time interval between a time point t07A and a time point t07B of the commutation signal PHS. At this time, the controller circuit 20 turns off the second high-side switch H2 and the first low-side switch L1, and turns on the first high-side switch H1 and the second low-side switch L2 during the second commutation procedure. As a result, a current I2 flows to the second low-side switch L2 through the single phase motor MT from the first high-side switch H1, and then flows to the sensing resistor RS.

That is, in the steady state mode, the controller circuit 20 may repeatedly switch the bridge driver circuit HBDV to repeatedly perform the first and second commutation procedures as described above to control the single phase motor MT to run stably in the steady state mode.

In step S103, the current limiting circuit 10 detects a current IS of the sensing resistor RS of the single phase motor MT.

In step S105, the current limiting circuit 10 compares the current IS of the sensing resistor RS with a current threshold to output a current comparison signal, and the controller circuit 20 determines whether or not the current IS of the sensing resistor RS is larger than the current threshold according to a level of the current comparison signal. If the controller circuit 20 determines that the current IS of the sensing resistor RS is not larger than the current threshold, for example, according to the current comparison signal at a low level, step S103 is performed again. Conversely, if the controller circuit 20 determines that the current IS of the sensing resistor RS is larger than the current threshold, for example, according to the current comparison signal at a high level, step S107 is then performed.

In step S107, the controller circuit 20 determines whether or not the present time falls within a maximum working period MDUTY of a first signal OT1S of the first node OUT1 or a second signal OT2S of a second node OUT2. A working period of the first signal OT1S or the second signal OT2S is equal to a predetermined period such as 50% during the maximum working period MDUTY. If the present time does not fall within any one of the maximum working periods MDUTY of the first signal OT1S and the second signal OT2S, step S103 is performed again. If the present time falls within the maximum working period MDUTY of the first signal OT1S or the second signal OT2S, a rest protection procedure of step S109 to S115 is performed.

In detail, as shown in FIG. 3, a waveform of each of cycles of the first signal OT1S and the second signal OT2S may have the maximum working period MDUTY, a first soft switching interval TS1, a first off time interval TF1, a second soft switching interval TS2, and a second off time interval TF2.

The working period of each of the first signal OT1S and the second signal OT2S is 0% during the first off time interval TF1. After the first off time interval TF1 ends, the present time reaches the first soft switching interval TS1. The controller circuit 20 performs a soft-switching process on the bridge driver circuit HBDV, such that the working period of each of the first signal OT1S and the second signal OT2S gradually increases during the first soft switching interval TS1. After the first soft switching interval TS1 ends, the present time reaches the maximum working period MDUTY during which the working period of each of the first signal OT1S and the second signal OT2S reaches the predetermined period such as 50%. After the maximum working period MDUTY ends, the present time reaches the second soft switching interval TS2. The controller circuit 20 performs a soft-switching process on the bridge driver circuit HBDV during the second soft switching interval TS2. The working period of each of the first signal OT1S and the second signal OT2S gradually decreases during the second soft switching interval TS2 and the second off time interval TF2.

A current limiting signal CL1 at a high level as shown in FIG. 4 represents that a current limiting procedure is performed when the current IS of the sensing resistor RS is larger than the current threshold. The controller circuit 20 switches one or more of the first high-side switch H1, the first low-side switch L1, the second high-side switch H2, and the second low-side switch L2 to drive the single phase motor MT to run in the steady state mode and limit currents flowing through the switch components, during the current limiting procedure.

The current IS of the sensing resistor RS may be larger than the current threshold during the first soft switching interval TS1, the first off time interval TF1, the second soft switching interval TS2 or the second off time interval TF2 instead of the maximum working period MDUTY, within a steady state time TCL. Under this condition, the current limiting procedure is deemed as a normal procedure.

It is worth noting that, the current limiting procedure is not allowed to be performed within any of the maximum working periods MDUTY of the first signal OT1S and the second signal OT2S. For example, when the current limiting procedure is performed within the maximum working period MDUTY of a fourth one of waveforms of the first signal OT1S as shown in a portion enclosed in a dashed circle in FIG. 4, the current limiting procedure is deemed as the normal procedure.

Therefore, when the current limiting circuit 10 determines that the current IS of the sensing resistor RS is larger than the current threshold within the maximum working period MDUTY, the current limiting circuit 10 outputs a current comparison signal CL1 at a high level at a time point t07B shown in FIG. 5. The controller circuit 20 starts performing the rest protection procedure of steps S109 to S115 at the time point t07B according to the current comparison signal CL1 at the high level.

In step S109, the commutation signal PHS is at a high level (or a low level in practice), during the time interval between the time point t07B and a commutation time point TRP1. At this time, the controller circuit 20 turns off the first high-side switch H1 and the second high-side switch H2, such that the single phase motor MT rotates inertially.

In step S111, the controller circuit 20 determines whether or not the present time reaches a next commutation time point of the commutation signal PHS to determine whether or not the first low-side switch L1 and the second low-side switch L2 need to be switched alternately. If the present time does not reach the next commutation time point of the commutation signal PHS, step S109 is performed again. If the present time reaches the next commutation time point of the commutation signal PHS, step S113 is then performed.

In step S113, the controller circuit 20 still turns off the first high-side switch H1 and the second high-side switch H2, and alternately switches the first low-side switch L1 and the second low-side switch L2 according to a level of the commutation signal PHS. As a result, a speed of the single phase motor MT gradually reduces. When the single phase motor MT stops to drive blades of a fan to rotate, step S115 is then performed.

Figure 6:
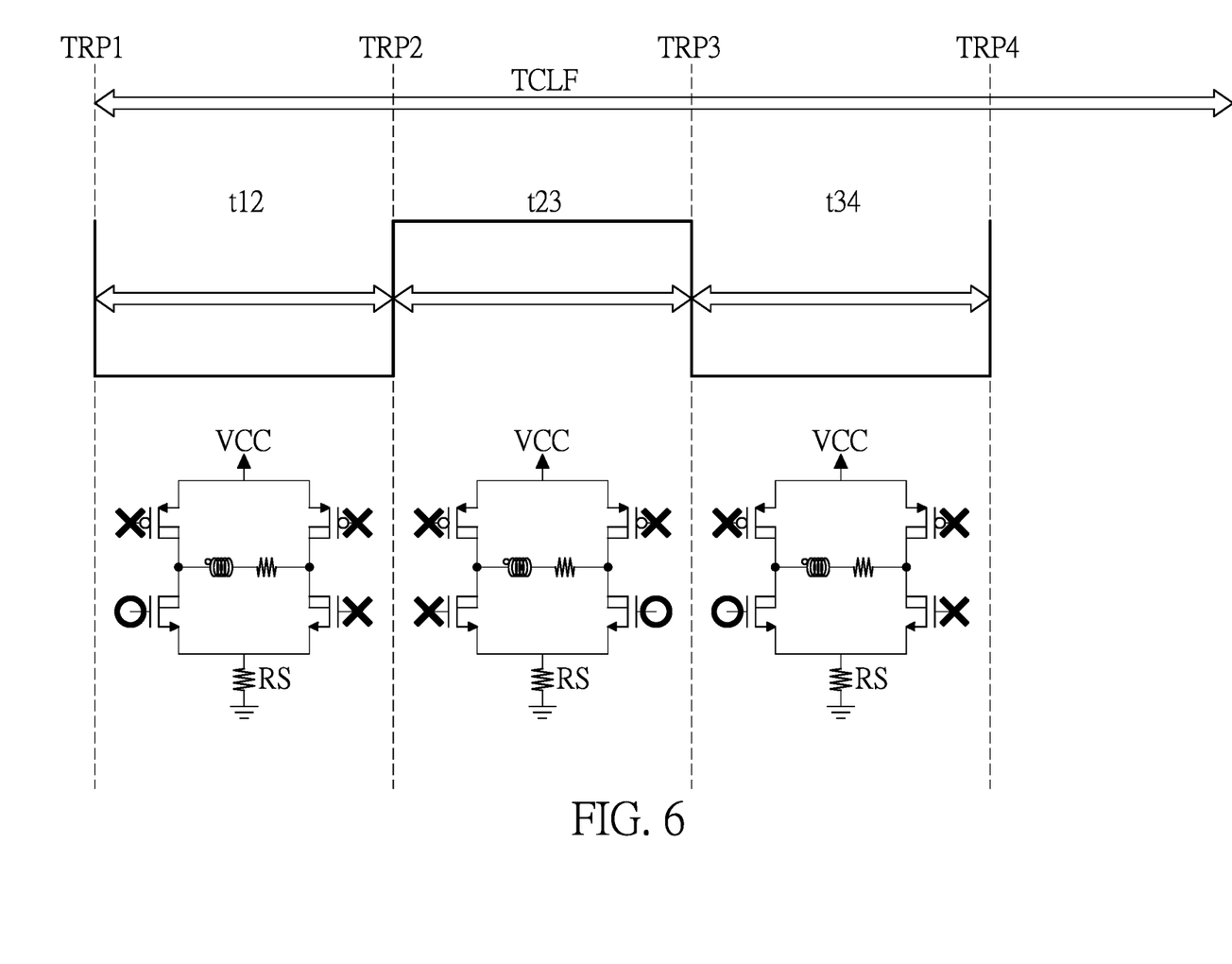
FIG. 6 is a schematic diagram of the bridge driver circuit of the single phase motor that is being switched when a rest protecting procedure is performed by the current limit protecting system and method of the motor pre-driver according to the embodiment of the present disclosure.

In detail, as shown in FIG. 6, the commutation signal PHS is at a low level (or a high level in practice) during a time t12 between the commutation time point TRP1 to a commutation time point TRP2 in the commutation signal PHS. At this time, the controller circuit 20 turns on the first low-side switch L1 and turns off the second low-side switch L2, and continually turns off the first high-side switch H1 and the second high-side switch H2.

As shown in FIG. 6, the commutation signal PHS is at a high level (or a low level in practice) during a time t23 between the commutation time point TRP2 and a commutation time point TRP3 in the commutation signal PHS. At this time, the controller circuit 20 turns off the first low-side switch L1 and turns on the second low-side switch L2, and still turns off the first high-side switch H1 and the second high-side switch H2.

Then, when the present time reaches the commutation time point TRP3 of the commutation signal PHS that is a time point of a rising edge (or a falling edge in practice) of the commutation signal PHS, the controller circuit 20 turns off the second low-side switch L2 and turns on the first low-side switch L1, and still turns off the first high-side switch H1 and the second high-side switch H2, during a time t34.

That is, as shown in FIG. 6, the controller circuit 20 still turns off the first high-side switch H1 and the second high-side switch H2, and alternately turns on the first low-side switch L1 and the second low-side switch L2, during the rest protection time TCLF. For example, when the commutation signal PHS is at a low level during non-working periods of the commutation signal PHS such as the times t12 and t34, the controller circuit 20 turns on the first low-side switch L1 and turns off the second low-side switch L2. When the commutation signal PHS is at a high level during a working period of the commutation signal PHS such as a time t13, the controller circuit 20 turns on the second low-side switch L2 and turns off the first low-side switch L1.

However, after the current limiting procedure is performed within the maximum working period MDUTY, the present time may reach the time point of the rising edge of the commutation signal PHS first, instead of the falling edge of the commutation signal PHS as shown in FIG. 6. Under this condition, the controller circuit 20 turns off the first low-side switch L1 and turns on the second low-side switch L2. Then, when the present time reaches a next commutation time point of the commutation signal PHS that is the time point of the falling edge of the commutation signal PHS, the controller circuit 20 turns off the second low-side switch L2 and turns on the first low-side switch L1.

It should be understood that, the present disclosure is not limited to the level of the commutation signal PHS. In practice, when the commutation signal PHS reaches the high level or the low level, any one of the switching operations of the bridge drive circuit HBDV as described herein may be performed, according to actual application requirements.

In step S115, the fan continually stops running for a period of time. Then, step S101 is performed again. In step S101, the controller circuit 20 switches the bridge drive circuit HBDV to drive the single phase motor MT to run in the steady state mode again.

Figure 7:
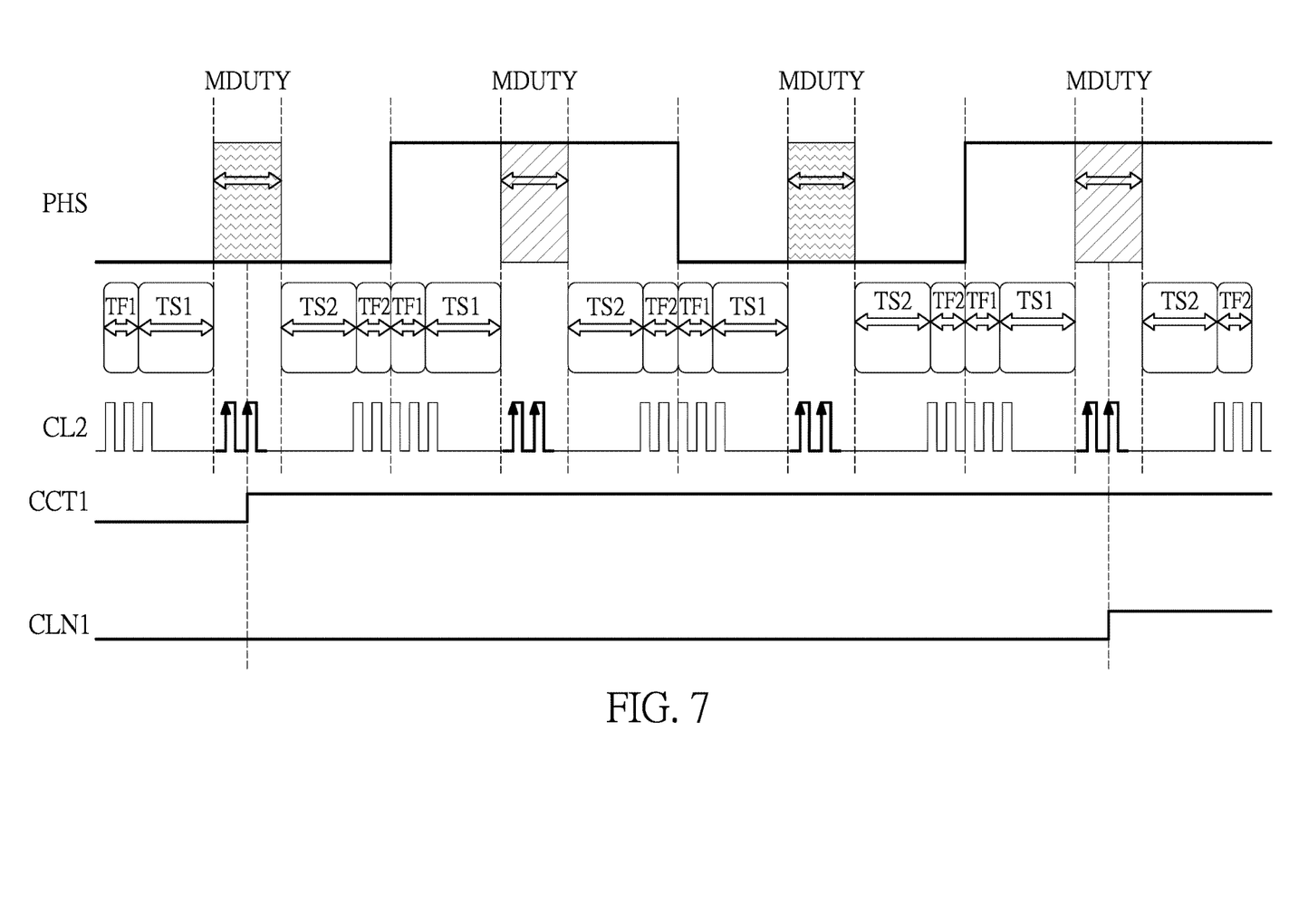
FIG. 7 is a first waveform diagram of signals that are generated when a current is compared with a current threshold multiple times respectively within a plurality of maximum working periods of the first signal and the second signal by the current limit protecting system and method of the motor pre-driver according to the embodiment of the present disclosure.

Reference is made to FIG. 7, which is a first waveform diagram of signals that are generated when a current is compared with a current threshold multiple times respectively within a plurality of maximum working periods of the first signal and the second signal by the current limit protecting system and method of the motor pre-driver according to the embodiment of the present disclosure. For the convenience of explanation, in FIG. 7, the maximum working periods MDUTY of the first signal OT1S and the second signal OT2S as shown in FIG. 3 are aligned and overlapped with the commutation signal PHS shown in FIG. 6. Each of the maximum working periods MDUTY of the second signal OT2S is aligned with the low level of the commutation signal PHS. Each of the maximum working periods MDUTY of the first signal OT1S is aligned with the high level of the commutation signal PHS.

As described above, each time when the controller circuit 20 determines that the current IS of the sensing current RS is larger than the current threshold within one of the maximum working periods MDUTY of the first signal OT1S or the second signal OT2S, the reset protection procedure is performed. That is, the current IS of the sensing resistor RS is only compared with the current threshold once within each of the maximum working periods MDUTY of the first signal OT1S and the second signal OT2S.

However, as shown in FIG. 7, the current limiting circuit 10 detects the current IS of the sensing resistor RS multiple times at different time points within the maximum working periods MDUTY. The current limiting circuit 10 compares the current IS detected each time with the current threshold to output the current comparison signal. That is, the current IS of the sensing resistor RS is compared with the current threshold multiple times within each of the maximum working periods MDUTY of the first signal OT1S and the second signal OT2S.

Then, the controller circuit 20 counts a number of times that the current IS of the sensing resistor RS is determined to be larger than the current threshold within each of the maximum working periods MDUTY by the current limiting circuit 10, according to a level such as a high level of the current comparison signal or a number of waveforms of the current comparison signal. When the controller circuit 20 determines that the number of times, such as twice shown in FIG. 7 reaches a predetermined number of times, the controller circuit 20 performs the rest protection program.

Alternatively, the controller circuit 20 counts a number of the consecutive maximum working periods MDUTY of the first signal OT1S or the second signal OT2S within each of which the current IS of the sensing resistor RS is larger than the current threshold, according to the level of the current comparison signal. When the controller circuit 20 determines that the number of the consecutive maximum working periods MDUTY is larger than a number threshold, the controller circuit 20 performs the rest protection program.

Alternatively, both of the above-mentioned conditions are conditions of performing the rest protection program. That is, the controller circuit 20 counts the number of times that the current IS of the sensing resistor RS is larger than the current threshold within each of the maximum working periods MDUTY as a first counted value. The controller circuit 20 counts the number of the consecutive maximum working periods MDUTY of the first signal OT1S or the second signal OT2S within each of which the current IS of the sensing resistor RS is larger than the current threshold as a second counted value. When the controller circuit 20 determines that the first counted value reaches the predetermined number of times such as twice, and the second counted value reaches the number threshold such as four according to the level of the current comparison signal, the controller circuit 20 performs the rest protection program.

For example, as shown in FIG. 7, in the embodiment, two values of the current IS of the sensing resistor RS are respectively detected at two time points within each of the maximum working periods MDUTY of the second signal OT2S, and each of the two values is larger than the current threshold, the first counted value is 2. Under this condition, a starting count signal CCT1 transits from a low level to a high level. At this time, the controller circuit 20 starts to count the second counted value according to the current comparison signal.

Then, as shown in FIG. 7, when the two values of the current IS of the sensing resistor RS are respectively detected at the two time points within each of four consecutive maximum working periods of the second signal OT2S, and each of the values is larger than the current threshold, the second counted value is 4.

When the first counted value reaches the predetermined number of times such as 2 and the second counted value reaches the number threshold such as 4, the controller circuit 20 starts to perform the rest protection procedure. As shown in FIG. 7, a rest protection procedure starting signal CLN1 transits from a low level to a high level.

Figure 8:
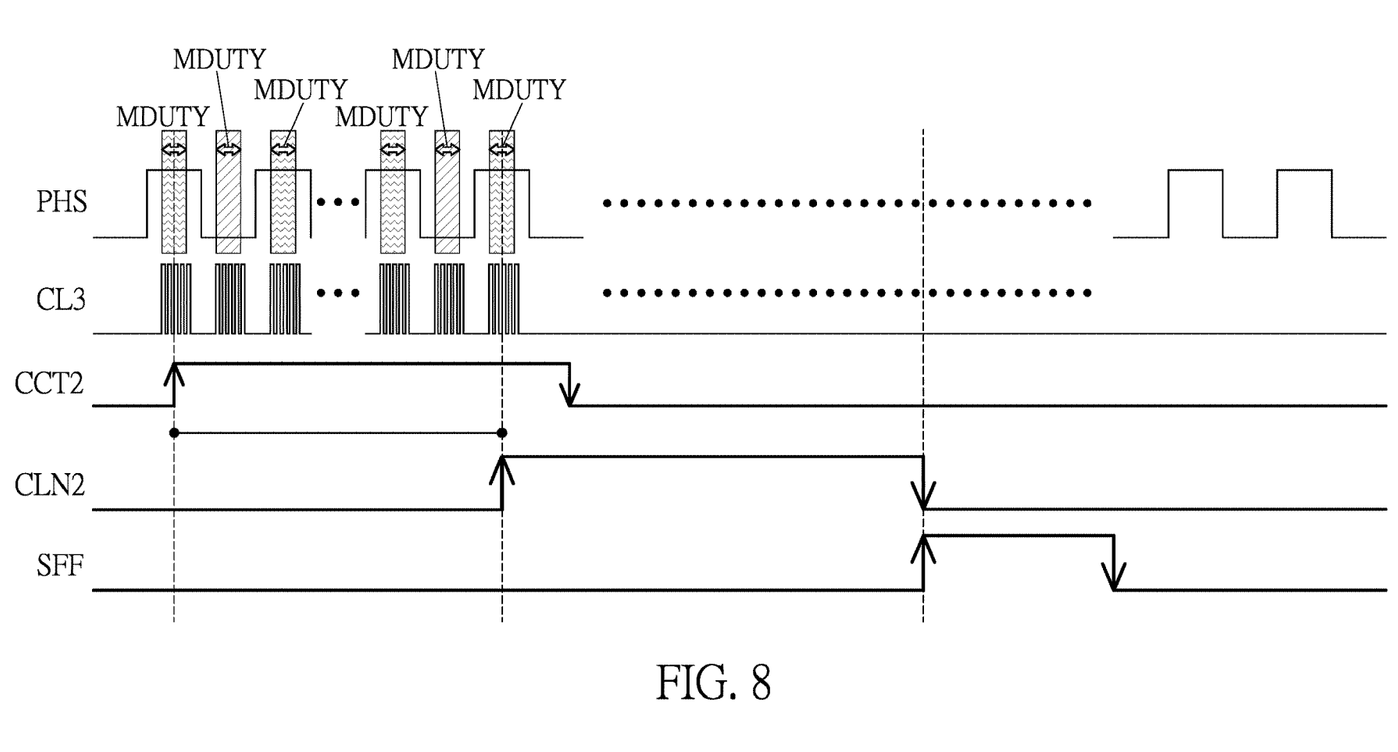
FIG. 8 is a second waveform diagram of signals that are generated when a current is compared with a current threshold multiple times within each of the maximum working periods of the first signal and the second signal by the current limit protecting system and method of the motor pre-driver according to the embodiment of the present disclosure.

Reference is made to FIG. 8, which is a first waveform diagram of signals that are generated when a current is compared with a current threshold multiple times within each of the maximum working periods of the first signal and the second signal by the current limit protecting system and method of the motor pre-driver according to the embodiment of the present disclosure.

The controller circuit 20 counts the number of times that the current IS of the sensing resistor RS is larger than the current threshold within each of the maximum working periods MDUTY as the first counted value, according to the current comparison signal. The controller circuit 20 counts the number of the consecutive maximum working periods MDUTY within each of which the current IS of the sensing resistor RS is larger than the current threshold as the second counted value, according to the current comparison signal. When the controller circuit 20 determines that the first counted value reaches the predetermined number of times such as thrice as indicated by a starting count signal CCT2, and the second counted value reaches the number threshold such as eight as indicated by a rest protection procedure starting signal CLN2, the rest protection procedure starting signal CLN2 transits from a low level to a high level as shown in FIG. 8. At this time, the controller circuit starts to perform the rest protection program to turn off the first high-side switch H1 and the second high-side switch H2, and alternately turns on the first low-side switch L1 and the second low-side switch L2 according to the level of the commutation signal PHS.

In the embodiment, the predetermined number of times is thrice and the number threshold is eight, but the present disclosure is not limited thereto. In practice, the predetermined number of times and the number threshold may be set according to actual requirements.

The speed of the single phase motor MT gradually reduces during the rest protection procedure. When the controller circuit 20 determines that the speed of the single phase motor MT reduces to zero such that the fan stops to rotate, the controller circuit 20 stops to perform the rest protection procedure, which is represented by the rest protection procedure starting signal CLN2 transiting from the high level to the low level as shown in FIG. 8. At this time, as shown in FIG. 8, a locking signal SFF transits from a low level to a high level, which means that the single phase motor MT is driven to run again after the single phase motor MT stops running for a period of time.

In summary, the present disclosure provides the current limit protecting system and method of the motor pre-driver, which has the following main characteristics:

1. the sensing resistor connected to the single phase motor is detected to obtain the current of the single phase motor;
2. the motor pre-driver compares the current flowing through the sensing resistor with the current threshold to determine whether or not the current limiting procedure is performed during the maximum working period of the first or second signal of the single phase motor;
3. when the current limiting procedure is performed during a time period that does not fall within the maximum working period, the current limiting procedure is still performed, but when the current limiting procedure is performed within the maximum working period, the rest protection procedure is performed to prevent the switch components such as the transistors of the bridge driver circuit from overheating.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A current limit protecting system of a motor pre-driver, which is applicable to a bridge driver circuit of a single phase motor, wherein the bridge driver circuit includes a plurality of switch components, the switch components include a first high-side switch, a first low-side switch, a second high-side switch, and a second low-side switch, a first terminal of the first high-side switch and a first terminal of the second high-side switch are coupled to a common voltage, a first node between a second terminal of the first high-side switch and a first terminal of the first low-side switch is connected to a first terminal of the single phase motor, a second node between a second terminal of the second high-side switch and a first terminal of the second low-side switch is connected to a second terminal of the single phase motor, the second terminal of the second high-side switch and a second terminal of the second low-side switch are connected to a first terminal of a sensing resistor, and a second terminal of the sensing resistor is grounded, the current limit protecting system of the motor pre-driver comprising:

a current limiting circuit connected to the first terminal of the sensing resistor and configured to sense a current flowing through the sensing resistor, and then compare the current with a current threshold to output a current comparison signal; and  a controller circuit connected to a control terminal of each of the switch components and the current limiting circuit, and configured to output a plurality of control signals respectively to the switch components to turn on or off the switch components according to the current comparison signal;

wherein, when the controller circuit determines that the current flowing through the sensing resistor is larger than the current threshold according to the current comparison signal, and a present time falls within any one of maximum working periods of a first signal of the first node or a second signal of the second node, the controller circuit performs a rest protection procedure on the bridge driver circuit to, during a fixed period of time, continually turn off the first high-side switch and the second high-side switch, and alternately turn on the first low-side switch and the second low-side switch;

wherein the controller circuit, according to a level of the current comparison signal, counts a number of times that the current flowing through the sensing resistor is determined to be larger than the current threshold within each of the maximum working Periods by the current limiting circuit, and when the controller circuit determines that the number of times reaches a predetermined number of times, the controller circuit performs the rest protection procedure.

2. The current limit protecting system of the motor pre-driver according to claim 1, wherein the controller circuit, according to the level of the current comparison signal, counts a number of the maximum working periods within each of which the current flowing through the sensing resistor is larger than the current threshold, the maximum working periods that are counted are consecutive, and when the controller circuit determines that the number of the maximum working periods that are counted is larger than a number threshold, the controller circuit performs the rest protection procedure.

3. The current limit protecting system of the motor pre-driver according to claim 1, wherein the controller circuit, according to the level of the current comparison signal, counts a number of times that the current flowing through the sensing resistor is larger than the current threshold within each of the maximum working periods, counts a number of the maximum working periods within each of which the current is larger than the current threshold and the maximum working periods that are counted are consecutive, and, when the controller circuit determines that the number of times reaches the predetermined number of times and the number of the maximum working periods is larger than a number threshold, the controller circuit performs the rest protection procedure.

4. A current limit protecting method of a motor pre-driver, which is applicable to a bridge driver circuit of a single phase motor, wherein the bridge driver circuit includes a plurality of switch components, the switch components include a first high-side switch, a first low-side switch, a second high-side switch, and a second low-side switch, a first terminal of the first high-side switch and a first terminal of the second high-side switch are coupled to a common voltage, a first node between a second terminal of the first high-side switch and a first terminal of the first low-side switch is connected to a first terminal of the single phase motor, a second node between a second terminal of the second high-side switch and a first terminal of the second low-side switch is connected to a second terminal of the single phase motor, the second terminal of the second high-side switch and a second terminal of the second low-side switch are connected to a first terminal of a sensing resistor, and a second terminal of the sensing resistor is grounded, the current limit protecting method of the motor pre-driver comprising the following steps:

detecting a current flowing through the sensing resistor;

determining whether or not the current is larger than a current threshold, in response to determining that the current is not larger than the current threshold, returning to the step of detecting the current flowing through the sensing resistor, and in response to determining that the current is larger than the current threshold, performing the next step;

counting a number of times that the current flowing through the sensing resistor is larger than the current threshold within each of the maximum working periods;

determining whether or not the number of times reaches a predetermined number of times, in response to determining that the number of times does not reach the predetermined number of times, returning to the step of determining whether or not the current is larger than the current threshold, and in response to determining that the number of times reaches the predetermined number of times, performing the next step;

determining whether or not a present time falls within any one of maximum working periods of a first signal of the first node or a second signal of the second node and the one of the maximum working periods is equal to a predetermined period, in response to determining that the present time does not fall within the one of the maximum working periods of the first signal or the second signal and the one of the maximum working periods is not equal to the predetermined period, switching the switch components and adjusting a working period of the first signal or the second signal to limit a current flowing through each of the switch components, such that the single phase motor runs stably, and then returning to the step of determining whether or not the number of times reaches the predetermined number of times, and in response to determining that the present time falls within the one of the maximum working periods of the first signal and the second signal and the one of the maximum working periods is equal to the predetermined period, performing the next step;

turning off the first high-side switch and the second high-side switch, and alternately turning on the first low-side switch and the second low-side switch, during a fixed period of time; and after the fixed period of time ends, automatically turning on the first high-side switch or the second high-side switch, and controlling the single phase motor to run stably.

5. The current limit protecting method of the motor pre-driver according to claim 4, comprising the following steps:

detecting the current flowing through the sensing resistor multiple times;

comparing the current detected each time with the current threshold to output a plurality of waveforms of the current comparison signal;

counting a number of the maximum working periods of the first signal or the second signal within each of which the current is larger than the current threshold, wherein the maximum working periods that are counted are consecutive; and determining whether or not the number of the maximum working periods is larger than a number threshold, in response to determining that the number of the maximum working periods is not larger than the number threshold, returning to the step of counting the number of the maximum working periods of the first signal or the second signal within each of which the current is larger than the current threshold, and in response to determining that the number of the maximum working periods is larger than the number threshold, turning off the first high-side switch and the second high-side switch, and alternately turning on the first low-side switch and the second low-side switch, during the fixed period of time.

\* \* \* \* \*